(12) United States Patent  
Utsumi et al.

(10) Patent No.: US 12,279,471 B2
(45) Date of Patent: Apr. 15, 2025

(54) DISPLAY DEVICE

(71) Applicant: SHARP KABUSHIKI KAISHA, Sakai (JP)

(72) Inventors: Hisayuki Utsumi, Sakai (JP); Masayuki Kanehiro, Sakai (JP); Youhei Nakanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 622 days.

(21) Appl. No.: 17/767,656

(22) PCT Filed: Oct. 24, 2019

(86) PCT No.: PCT/JP2019/041613
§ 371 (c)(1),
(2) Date: Apr. 8, 2022

(87) PCT Pub. No.: WO2021/079449
PCT Pub. Date: Apr. 29, 2021

(65) Prior Publication Data
US 2023/0276648 A1 Aug. 31, 2023

(51) Int. Cl.
H01L 51/50 (2006.01)
H10K 50/16 (2023.01)
H10K 59/131 (2023.01)
H10K 59/35 (2023.01)
H10K 59/80 (2023.01)
H10K 102/00 (2023.01)

(52) U.S. Cl.
CPC ........... *H10K 50/16* (2023.02); *H10K 59/131* (2023.02); *H10K 59/353* (2023.02); *H10K 59/871* (2023.02); *H10K 2102/351* (2023.02)

(58) Field of Classification Search
None
See application file for complete search history.

(56) References Cited

U.S. PATENT DOCUMENTS

2002/0106529 A1  8/2002  Okunaka et al.
2017/0025481 A1* 1/2017  Sung .................... A61N 5/0624
2017/0288162 A1  10/2017  Akiyama et al.

FOREIGN PATENT DOCUMENTS

CN    102208568 A    10/2011
JP    2013-171968 A   9/2013
JP    2017183510 A   10/2017

* cited by examiner

Primary Examiner — Gregory D Clark
(74) Attorney, Agent, or Firm — ScienBiziP, P.C.

(57) ABSTRACT

Provided are a support substrate, a thin-film transistor layer, a light emitter layer having a plurality of light emitters that emit mutually different colors of light, and a sealing layer sealing the light emitter layer. Each light emitter includes a first electrode, a hole transportation layer, an emissive layer, an electron transportation layer, and a second electrode. The electron transportation layer contains an oxide nanoparticle, a binder resin, and a photo-initiator.

20 Claims, 9 Drawing Sheets

DISPLAY DEVICE

TECHNICAL FIELD

The disclosure relates to a display device that includes light emitters having a hole transportation layer (HTL), an emissive layer (EML), and an electron transportation layer (ELT).

BACKGROUND ART

Patent Literature 1 discloses a display device that includes light emitters having a cathode and an electron transportation layer both shared among a plurality of pixel electrodes.

CITATION LIST

Patent Literature

Patent Literature 1: Japanese Unexamined Patent Application Publication No. 2017-183510

SUMMARY OF INVENTION

Technical Problem

The efficiency of electron injection from an electron transportation layer of a light emitter to an emissive layer of the light emitter typically differs depending on what kind of emissive layer and what kind of electron transportation layer are used. For a cathode and an electron transportation layer both shared among a plurality of light emitters having their respective emissive layers different from each other, like the display device described in Patent Literature 1, it is difficult to optimize, between the plurality of light emitters, the efficiency of electron injection from the electron transportation layer to the emissive layer.

Solution to Problem

A display device according to the disclosure has a display region having a plurality of pixels, and a frame region around the display region. The display region includes, in listing order, a substrate, a thin-film transistor layer, a light emitter layer having a plurality of light emitters that emit mutually different colors of light, and a sealing layer sealing the light emitter layer. The plurality of light emitters include, in listing order on the substrate, a first electrode, a hole transportation layer, an emissive layer, an electron transportation layer, and a second electrode. Either one of the first electrode and the second electrode is an island-shaped electrode provided for each of the plurality of light emitters. The other one of the first electrode and the second electrode is a common electrode shared among the plurality of light emitters. The electron transportation layer contains an oxide nanoparticle, a binder resin, and a photo-initiator.

Advantageous Effect

The aspect of the disclosure can further facilitate the optimization of a difference in electron injection efficiency between light emitters even when the kind of an emissive layer differs between the light emitters.

DESCRIPTION OF EMBODIMENTS

First Embodiment

The term "in the same layer" hereinafter refers to that one layer is formed in the same process step as and made of the same material as another layer. In addition, the term "in a lower layer than (or under)" hereinafter refers to that one layer is formed in a process step anterior to a process step of forming a comparative layer. In addition, the term "in a higher layer than (or over)" hereinafter refers to that one layer is formed in a process step posterior to a process step of forming a comparative layer. Moreover, the Description defines the direction from the lower layer of a display device toward the upper layer of the display device as an upward direction.

Figure 1:
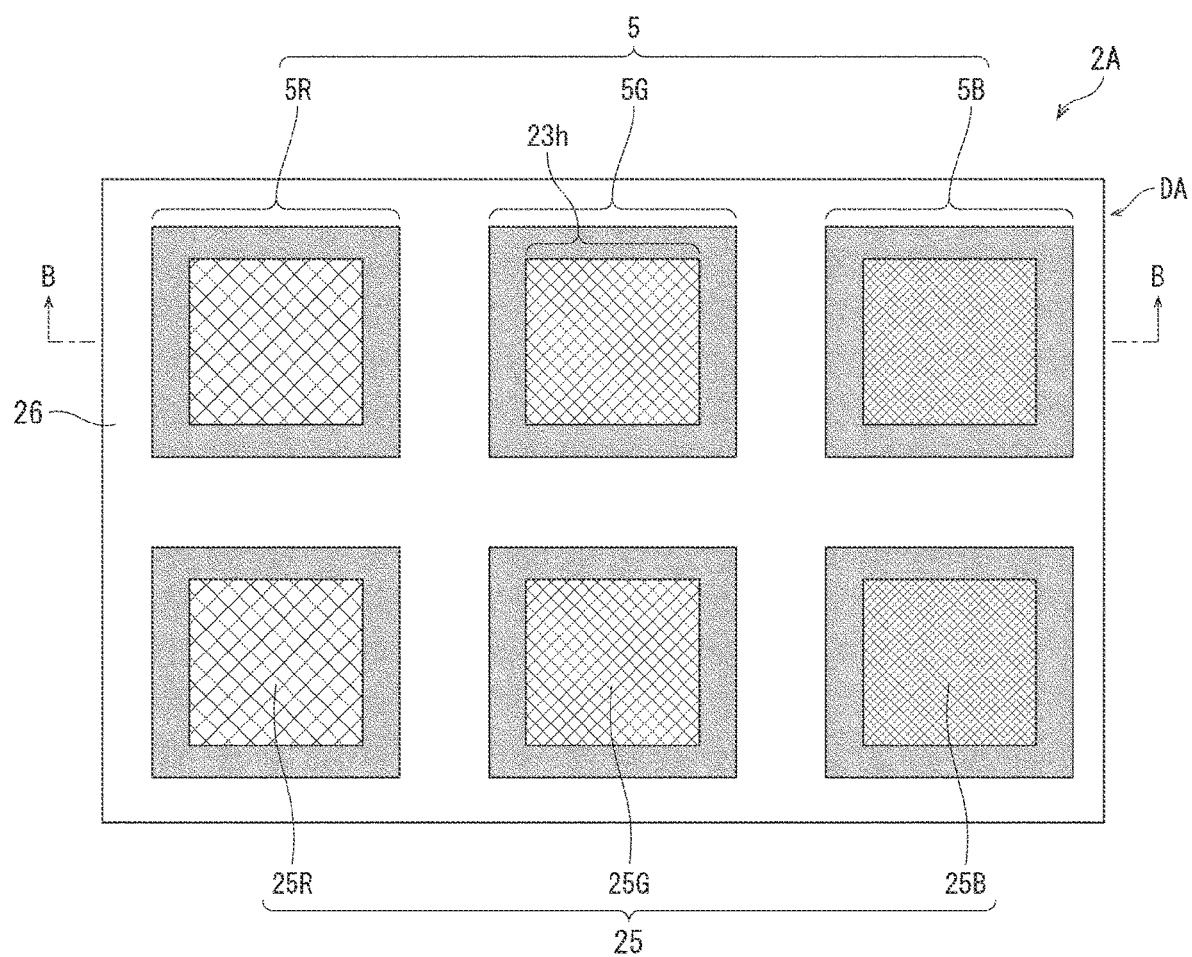
FIG. 1 is an enlarged top view of an example configuration of main components in the display region of a display device according to a first embodiment.
Figure 2:
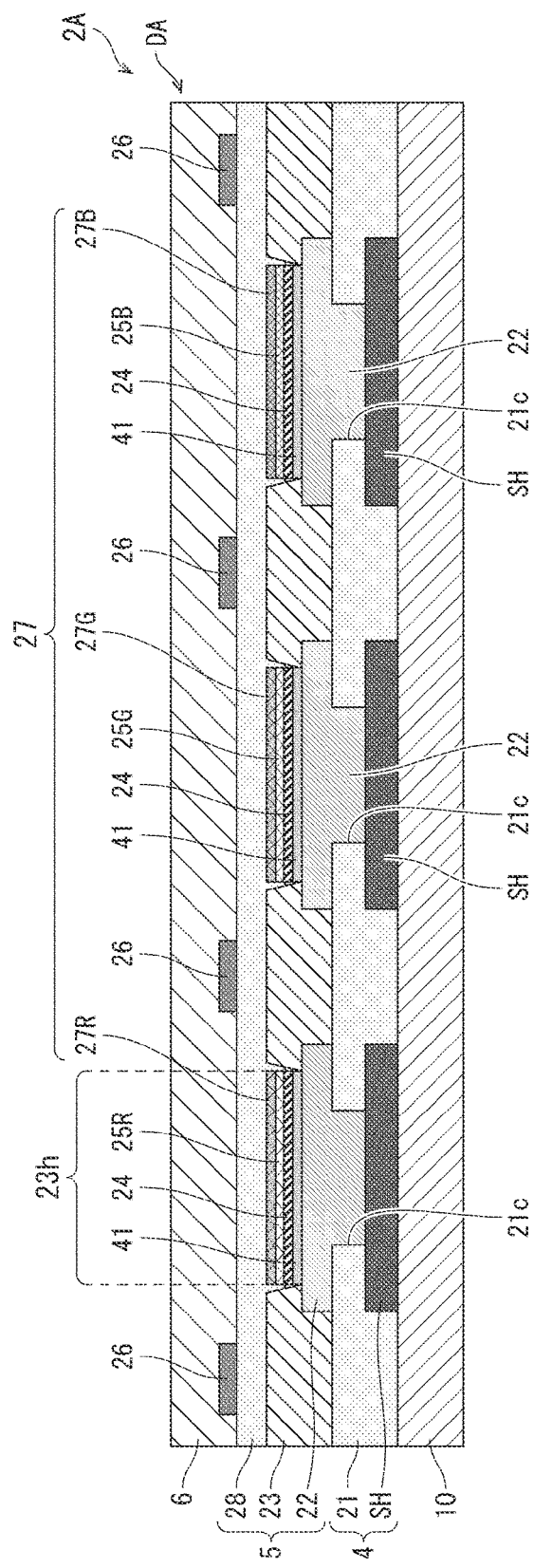
FIG. 2 is a sectional side view of the example configuration of the main components in the display region of the display device taken along line BB in FIG. 1.
Figure 3:
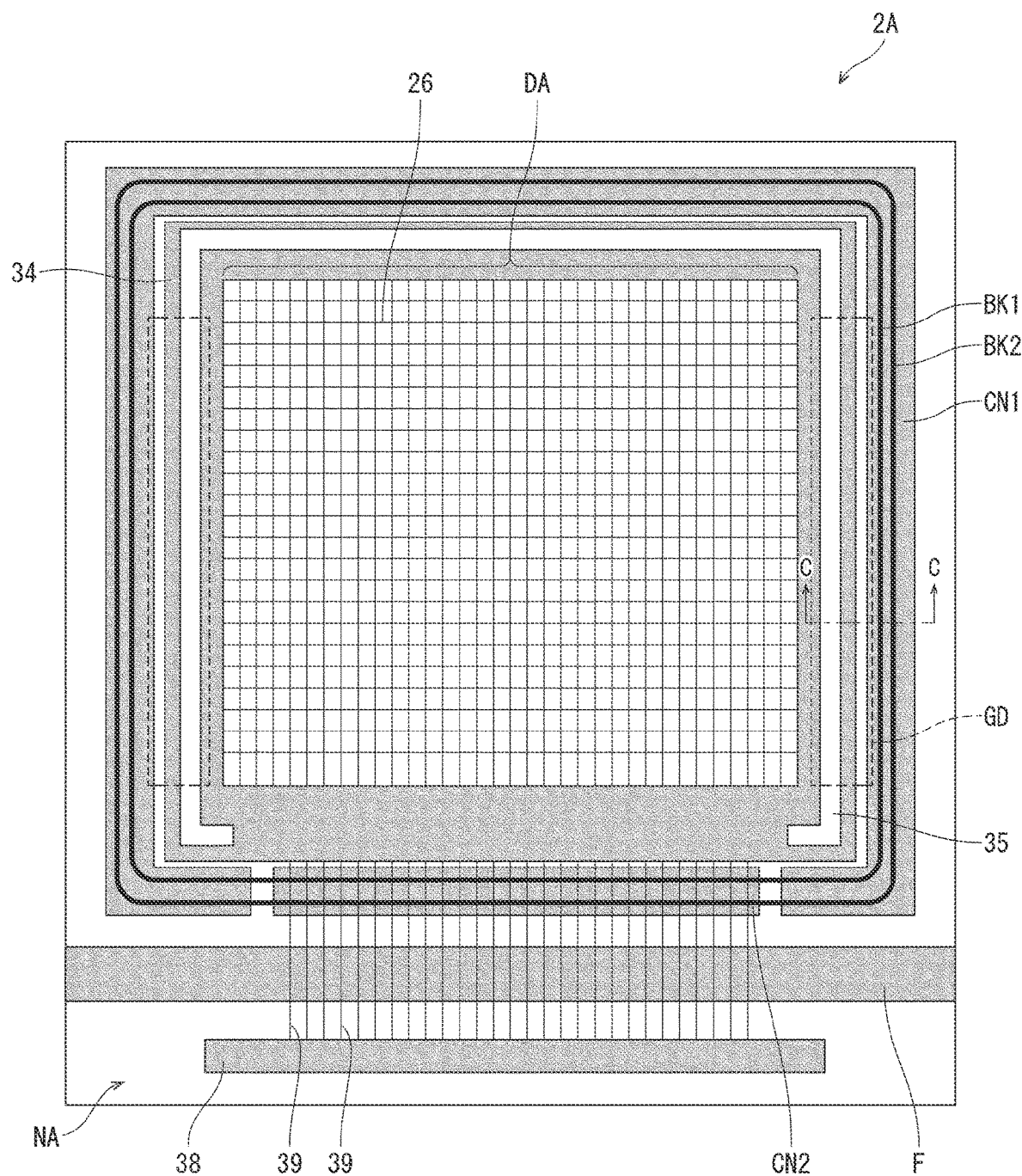
FIG. 3 is a perspective top view of the display device.
Figure 4:
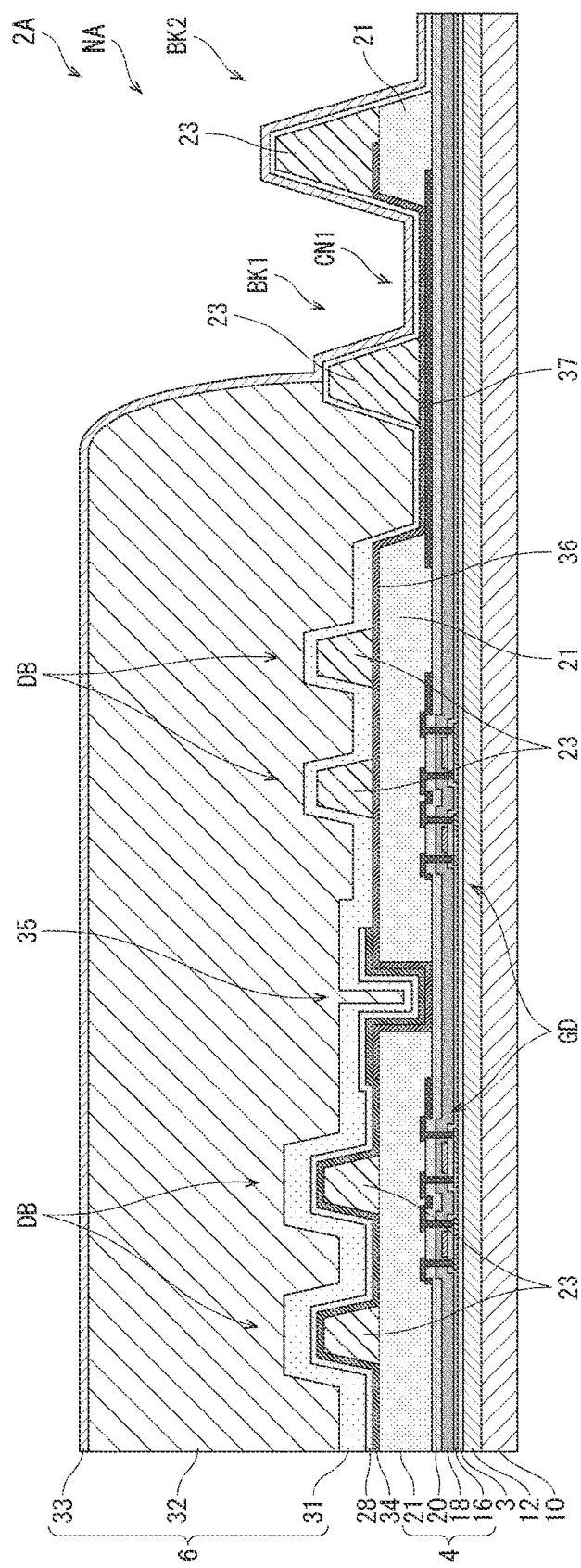
FIG. 4 is a sectional side view of an example configuration of main components in the frame region of the display device taken along line CC in FIG. 3.

FIG. 1 is an enlarged top view of an example configuration of main components in the display region, DA, of a display device 2A according to a first embodiment. FIG. 2 is a sectional side view of the example configuration of the main components in the display region DA of the display device 2A taken along line BB in FIG. 1. FIG. 3 is a perspective top view of the display device 2A. FIG. 4 is a sectional side view of an example configuration of main components in the frame region, NA, of the display device 2A taken along line CC in FIG. 3. It is noted that a hole transportation layer, a second electrode, a sealing layer, all described later on, and other components are not shown in FIG. 1. It is also noted that a specific configuration of the sealing layer, a specific configuration of a TFT layer, described later on, a barrier layer, and a resin layer are not shown in FIG. 3.

The display device 2A according to this embodiment has the display region DA and the frame region NA disposed around and adjacent to the display region DA, as illustrated in FIG. 3. As illustrated in FIG. 1, the display region DA includes the following: a red sub-pixel including a red light emitter 5R; a green sub-pixel including a green light emitter 5G; and a blue sub-pixel including a blue light emitter 5B. These red, green and blue sub-pixels constitute a single pixel, and the display region DA includes a plurality of pixels, which are designed to display information.

In FIGS. 1 and 2, an electron transportation layer 27R, included in the red light emitter 5R, is made of a material suitable for the valence band maximum (VBM) and conduction band minimum (CBM) of the red emissive layer 25R, included in the red light emitter 5R. In addition, an electron transportation layer 27G, included in the green light emitter 5G, is made of a material suitable for the VBM and CBM of the green emissive layer 25G, included in the green light emitter 5G. In addition, an electron transportation layer 27B, included in the blue light emitter 5B, is made of a material suitable for the VBM and CBM of the blue emissive layer 25B, included in the blue light emitter 5B. The details will be described later on. The VBMs correspond to the highest occupied molecular orbital (HOMO). The CBMs correspond to the lowest unoccupied molecular orbital (LUMO).

As illustrated in FIG. 2, the display device 2A according to this embodiment includes the following disposed sequentially from the bottom: a support substrate 10, a thin-film transistor layer 4, a light emitter layer 5, and a sealing layer 6. The display device 2A may include, further over the sealing layer 6, a function film that serves as, but not limited to, an optical compensator, a touch sensor and a protector and may include other components. Disposed between the thin-film transistor layer 4 and support substrate 10 are a resin layer and a barrier layer (both are not shown).

The support substrate 10 may be a flexible substrate, such as a PET film, or a rigid substrate, such as a glass substrate. An example of the material of the resin layer is polyimide.

The barrier layer prevents foreign substances, such as water and oxygen, from intruding into the thin-film transistor layer 4 and light emitter layer 5 when the display device 2A is used. The barrier layer can be composed of a silicon oxide film, a silicon nitride film, or a silicon oxide nitride film, all of which are formed through CVD, or can be composed of a stack of these films, for instance.

The thin-film transistor layer 4 includes a source wire SH and a flattening film 21. An example specific configuration of the thin-film transistor layer 4 will be described later on with reference to FIG. 8 and other drawings.

The source wire SH may contain at least one of, for instance, aluminum (Al), tungsten (W), molybdenum (Mo), tantalum (Ta), chromium (Cr), titanium (Ti), and copper (Cu). The source wire SH is composed of a monolayer film or laminated film of the foregoing metals. The source wire SH in this embodiment in particular contains Al.

As illustrated in FIG. 2, the light emitter layer 5 (e.g., organic light-emitting diode layer) includes the following: first electrodes 22 (anodes); a hole injection layer 41; a hole transportation layer 24; an emissive layer 25 including the red emissive layer 25R, the green emissive layer 25G, and the blue emissive layer 25B; an edge cover 23 covering the edges of the first electrodes 22; an auxiliary wire 26; the electron transportation layers 27R, 27G, and 27B; and the second electrode 28 (cathode).

The light emitter layer 5 in this embodiment includes the following as a plurality of light emitters: the red light emitter 5R including the red emissive layer 25R; the green light emitter 5G including the green emissive layer 25G; and the blue light emitter 5B including the blue emissive layer 25B.

The first electrodes 22 are disposed at locations overlapping the flattening film 21 and contact holes 21c in a plan view. The first electrodes 22 are electrically connected to the source wire SH via the contact holes 21c. The first electrodes 22 are hence supplied with a signal from the thin-film transistor layer 4 via the source wire SH. The first electrodes 22 may be 100 nm thick for instance. The first electrodes 22 in this embodiment are composed of a laminate of indium tin oxide (ITO) and Ag-containing alloy for instance and reflects light.

The hole transportation layer 24 in this embodiment is disposed on the hole injection layer 41. The hole transportation layer 24 is an inorganic hole transportation layer and contains, as a hole transportation material, NiO or MgNiO.

The emissive layer 25 is disposed at a location overlapping each of the first electrodes 22 and is provided for each of the plurality of light emitters. The emissive layer 25 in this embodiment includes the foregoing red emissive layer 25R, green emissive layer 25G and blue emissive layer 25B for each of the plurality of light emitters.

The red emissive layer 25R, green emissive layer 25G and blue emissive layer 25B in this embodiment emit red light, green light and blue light, respectively. That is, the red light emitter 5R, the green light emitter 5G, and the blue light emitter 5B are light emitters that emit red light, green light and blue light, respectively.

Blue light herein refers to light with a light-emission center wavelength that falls within a wavelength band of 400 to 500 nm inclusive. Green light herein refers to light with a light-emission center wavelength that falls within a wavelength band of greater than 500 nm and equal to or smaller than 600 nm. Red light herein refers to light with a light-emission center wavelength that falls within a wavelength band of greater than 600 nm and equal to or smaller than 780 nm.

The edge cover 23 is an organic insulating film and contains an organic material, such as polyimide or acrylic. The edge cover 23 is disposed at a location covering the edge of each first electrode 22. The edge cover 23 has an opening 23h, provided for each of the plurality of light emitters, and part of each first electrode 22 is exposed from the edge cover 23. The edge cover 23 thus divides the individual pixels of the display device 2A into a red sub-pixel, a green sub-pixel, and a blue sub-pixel.

The auxiliary wire 26 in this embodiment is disposed at a location overlapping the edge cover 23. The auxiliary wire 26 is provided in the form of a lattice, as illustrated in FIG. 3. The auxiliary wire 26 in this embodiment is in contact with the second electrode 28 adjacent to the sealing layer 6. In this embodiment, the shape of the auxiliary wire 26 is not limited to what is shown in FIG. 3, where a plurality of linear auxiliary wires 26 arranged at substantially regular intervals intersect with each other vertically. For instance, the shape of the auxiliary wire 26 may be like a pentile, where the interval between the auxiliary wires 26 adjacent to each other differs depending on a location, or where the auxiliary wires 26 intersect with each other obliquely.

The auxiliary wire 26 may be made of silver. Silver is a material that is typically used for the backplane of a display device, such as a metal layer of the thin-film transistor layer 4. The auxiliary wire 26 is made of silver, which can be thus also used as a material for forming the backplane when forming the auxiliary wire 26. The auxiliary wire 26 may be made of Al or Cu alone; alternatively, the auxiliary wire 26 may be composed of a Ti—Al—Ti laminated layer or a W—Ta laminated layer.

The electron transportation layer 27 is disposed at a location overlapping each of the first electrodes 22 and is provided for each of the plurality of light emitters. The electron transportation layer 27 in this embodiment includes the electron transportation layer 27R for the red light emitter 5R, the electron transportation layer 27G for the green light emitter 5G, and the electron transportation layer 27B for the blue light emitter 5B.

Figure 5:
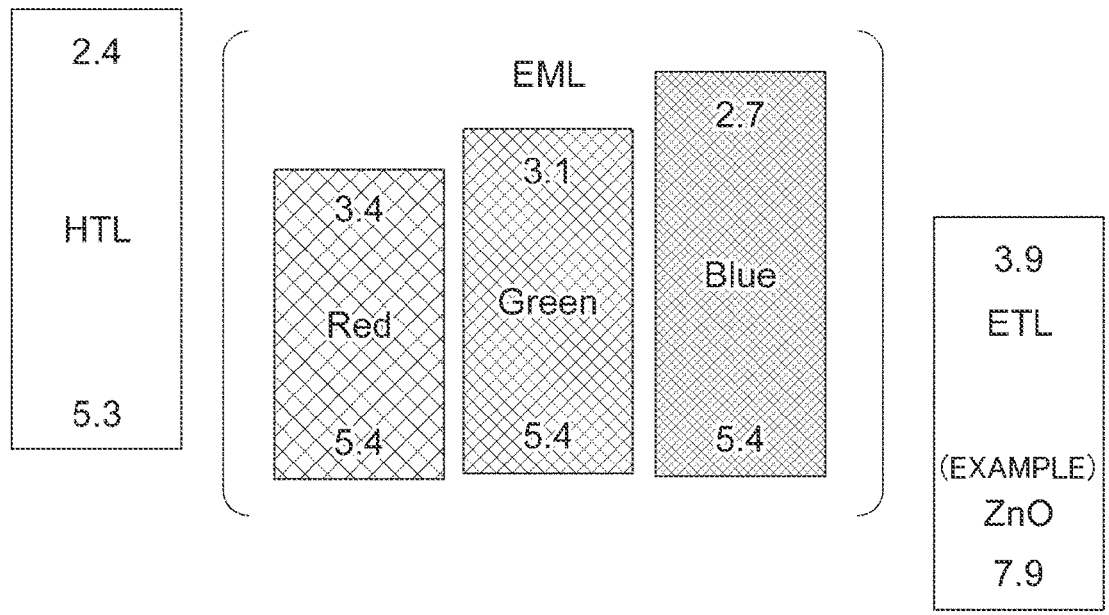
FIG. 5 illustrates example energy levels in main components of a light emitter layer of the display device.

FIG. 5 illustrates example energy levels in main components of the light emitter layer 5 of the display device 2A. In a QLED cell element structure, the emissive materials of the emissive layers of three colors 25R, 25G and 25B have their respective VBMs different from each other and their respective CBMs different from each other when the emissive layer 25 with the hole injection layer 41, hole transportation layer 24, emissive layer 25, and electron transportation layers 27R, 27G and 27B being stacked sequentially from the bottom is divided by three-color separation into the red emissive layer 25R, the green emissive layer 25G, and the blue emissive layer 25B, as illustrated in FIG. 2 for instance. Accordingly, using, throughout all the three colors, the same material for components except the emissive layers of three colors 25R, 25G and 25B can reduce light emission brightness and external quantum efficiency (EQE) or can degrade the chromaticity of the emissive layers 25R, 25G and 25B, due to the difference in emissive material between the emissive layers of three colors 25R, 25G and 25B. FIG. 5 illustrates, by way of example, the red emissive layer 25R having a VBM of 3.4 and a CBM of 5.4, the green emissive layer 25G having a VBM of 3.1 and a CBM of 5.4, and the blue emissive layer 25B having a VBM of 2.7 and a CBM of 5.4. The red emissive layer 25R, the green emissive layer 25G, and the blue emissive layer 25B thus have their respective VBMs different from each other.

The electron transportation layers 27R, 27G and 27B according to this embodiment are made of materials suitable for the respective red emissive layer 25R, green emissive layer 25G and blue emissive layer 25B. The following (Table 1) shows an example of the materials.

TABLE 1

| HIL | HTL | EML | | | ETL |
|---|---|---|---|---|---|
| PEDOT; PSS | TFB | Red | CBM 3.4 (eV) VBM 5.4 (eV) | ZnO (N-12) | CBM 4.3 (eV) VBM 7.2 (eV) |
| | | Green | CBM 3.1 (eV) VBM 5.4 (eV) | ZnO (N-11) | CBM 3.9 (eV) VBM 7.2 (eV) |
| | | Blue | CBM 2.7 (eV) VBM 5.4 (eV) | ZnMgO | CBM 3.4 (eV) VBM 7.2 (eV) |

The electron transportation layer (ETL) 27R, corresponding to the red emissive layer (EML) 25R, is made of ZnO including a reagent (N-12) for instance. The electron transportation layer 27R has a CBM of 4.3 eV and a VBM of 7.2 eV. The corresponding red emissive layer 25R has a CBM of 3.4 eV and a VBM of 5.4 eV.

The hole transportation layer (HTL) 24 is made of TFB for instance, and the hole injection layer (HIL) 41 is made of PEDOT; PSS for instance. TFB herein refers to poly[(9, 9'-dioctylfluorenyl-2,7-diyl)-co-(4,4'-(N-(4-sec-butyl))di-phenylamine)].

The electron transportation layer 27G, corresponding to the green emissive layer 25G, is made of ZnO including a reagent (N-11) for instance. The electron transportation layer 27G has a CBM of 3.9 eV and a VBM of 7.2 eV. The corresponding green emissive layer 25G has a CBM of 3.1 eV and a VBM of 5.4 eV.

The electron transportation layer 27B, corresponding to the blue emissive layer 25B, is made of ZnMgO for instance. The electron transportation layer 27B has a CBM of 3.4 eV and a VBM of 7.2 eV. The corresponding blue emissive layer 25B has a CBM of 2.7 eV and a VBM of 5.4 eV.

N-vinyl-2-pyrrolidone is used as the monomers of a binder resin. 2-hydroxy-4'-(2-hydroxyethoxy)-2-methylpropiophenone is used as a photo-initiator.

As described above, a material of the electron transportation layer 27R suitable for the CBM and VBM of the red emissive layer 25R is selected, a material of the electron transportation layer 27G suitable for the CBM and VBM of the green emissive layer 25G is selected, and a material of the electron transportation layer 27B suitable for the CBM and VBM of the blue emissive layer 25B is selected. The electron transportation layers 27R, 27G, and 27B each made of the material suitable for the emissive layer of the corresponding color are color coded through photolithography. The materials of the respective electron transportation layers 27R, 27G and 27B each include oxide nanoparticles of ZnO, ZnMgO, LiZnO or other substances as an electron transportation material and include a monomer resin (binder resin), a photo-initiator, and other things.

Examples of the monomer resin include the following: a monosubstituted ethylene compound (vinyl compound), including a styrene derivative, acrylonitrile, acrylic-acid ester, an acrylamide derivative, N-vinylpyrrolidone, α-olefins, and vinyl ethers; 1,1-disubstituted ethylene (vinylidene compound), including methacrylic-acid ester and a methacrylamide derivative; and a diene compound, including 1,3-butadiene and isoprene.

Examples of the photo-initiator include the following: an acetophenone-based compound, including acetophenone, 2,2-diethoxyacetophenone, 2,2-dimethoxy-2-phenylacetophenon, and 2-ethoxy-2-phenylacetophenone; a benzophenone-based compound, including benzophenone and p,p'-tetramethyldiaminobenzophenone; a propyrrophenone-based compound, including 2-hydroxy-4'-(2-hydroxyethoxy)-2-methylpropiophenone; 2,2'-azobis(2-methylpropionamidine)dihydrochloride; and 2,2'-azobis[2-(2-imidazoline-2-yl)propane]dihydrochloride.

These photo-initiators according to this embodiment generate no acid when light irradiation, which is herein UV irradiation, is performed to perform a photopolymerization (initiation) process. The photo-initiators hence do not damage the light emitters by such acid during the photopolymerization (initiation) process. As described above, the photo-initiators according to this embodiment contain a compound that generates no acid in response to light irradiation for initiating a polymerization reaction.

Regulating the weight ratio of the monomer resin or changing the monomer resin can regulate the thickness and mobility of the electron transportation layers 27R, 27G and 27B suitable for the materials of the respective red emissive layer 25R, green emissive layer 25G and blue emissive layer 25B. Color coding through photolithography can apply the electron transportation layers 27R, 27G, and 27B uniformly.

The following (Table 2) shows another example. In this example, the VBM and CBM differ depending on the particle size of ZnO.

TABLE 2

| HIL | HTL | EML | | | ETL |
|---|---|---|---|---|---|
| PEDOT; PSS | TFB | Red | CBM 3.4 (eV) VBM 5.4 (eV) | ZnO ($\phi$ = 5.5 nm) | CBM 3.8 (eV) VBM 7.2 (eV) |
| | | Green | CBM 3.1 (eV) VBM 5.4 (eV) | ZnO ($\phi$ = 3.2 nm) | CBM 3.2 (eV) VBM 7.2 (eV) |
| | | Blue | CBM 2.7 (eV) VBM 5.4 (eV) | ZnO ($\phi$ = 2.6 nm) | CBM 2.7 (eV) VBM 7.2 (eV) |

The electron transportation layer 27R, corresponding to the red emissive layer 25R, is made of ZnO in the form of 5.5 nm large particles. The electron transportation layer 27R has a CBM of 3.8 eV and a VBM of 7.2 eV.

The electron transportation layer 27G, corresponding to the green emissive layer 25G, is made of ZnO in the form of 3.2 nm large particles. The electron transportation layer 27G has a CBM of 3.2 eV and a VBM of 7.2 eV.

The electron transportation layer 27B, corresponding to the blue emissive layer 25B, is made of ZnO in the form of 2.6 nm large particles. The electron transportation layer 27B has a CBM of 2.7 eV and a VBM of 7.2 eV.

In this embodiment, the CBM may be varied between the electron transportation layers 27R, 27G and 27B of the respective light emitters by using different materials for the respective electron transportation layers 27R, 27G and 27B, between the red light emitter 5R, green light emitter 5G and blue light emitter 5B, which are different from each other.

For instance, the electron transportation layer 27R may contain oxide nanoparticles, which are herein ZnO nanoparticles. Further, the electron transportation layer 27G may contain oxide nanoparticles, which are herein MgZnO nanoparticles. Furthermore, the electron transportation layer 27B may contain oxide nanoparticles, which are herein LiZnO nanoparticles.

In this embodiment, the electron transportation layers 27R, 27G, and 27B may have their respective VBMs different from each other in the pixels and their respective CBMs different from each other in the pixels, and the electron transportation layers 27R, 27G, and 27B may contain the same material. In this embodiment for instance, the electron transportation layers 27R, 27G, and 27B may contain the same oxide nanoparticle material between the red light emitter 5R, green light emitter 5G and blue light emitter 5B, which are different from each other. Here, the band gap of each electron transportation layer 27 may be varied by varying the particle diameter of the oxide nanoparticles contained in the electron transportation layers 27R, 27G, and 27B.

For instance, the electron transportation layers 27R, 27G, and 27B may contain ZnO nanoparticles as oxide nanoparticles in any of the light emitters. Here, the ZnO nanoparticles within the electron transportation layer 27R may have a particle diameter larger than the particle diameter of the ZnO nanoparticles within the electron transportation layer 27G, and the ZnO nanoparticles within the electron transportation layer 27G may have a particle diameter larger than the particle diameter of the ZnO nanoparticles within the electron transportation layer 27B. To be specific, the ZnO nanoparticles within the electron transportation layer 27R preferably have a particle diameter of 5 to 8 nm inclusive. In addition, the ZnO nanoparticles within the electron transportation layer 27G preferably have a particle diameter of 3 to 5 nm inclusive. In addition, the ZnO nanoparticles within the electron transportation layer 27B preferably have a particle diameter of 1.5 to 3 nm inclusive.

In this embodiment, the band gap may be varied between the electron transportation layers 27R, 27G and 27B by varying the composition ratio of the oxide nanoparticle contained in each of the electron transportation layers 27R, 27G and 27B between the red light emitter 5R, green light emitter 5G and blue light emitter 5B, which are different from each other. For instance, the electron transportation layers 27R, 27G, and 27B may contain oxide nanoparticles, which are herein $Mg_xZn_{1-x}O$ nanoparticles, where x is a real number equal to or greater than 0 and less than 1. Here, the value of x may increase gradually in order starting with the electron transportation layer 27R, followed by the electron transportation layer 27G, followed by the electron transportation layer 27B.

To be specific, the value of x in the electron transportation layer 27R may be equal to or greater than 0 and less than 0.1. Further, the value of x in the electron transportation layer 27G may be equal to or greater than 0.1 and less than 0.3. Still further, the value of x in the electron transportation layer 27B may be equal to or greater than 0.3 and less than 0.5.

As illustrated in FIG. 2, the second electrode 28 is disposed on the electron transportation layer 27 as a common electrode shared among the plurality of light emitters. The second electrode 28 includes metal nanowires and has high light transparency. The metal nanowires included in the second electrode 28 may be silver nanowires for instance. Other than the foregoing, the second electrode 28 may include conductive metal nanowires, such as gold nanowires, aluminum nanowires, or copper nanowires. The second electrode 28 is electrically connected to the auxiliary wires 26, which are disposed on the second electrode 28.

The material of the second electrode 28 in this embodiment may be a mixed material containing a silver-nanowire dispersed solution. The mixed material may also contain a binder, a dispersant, or other additives. The material of the second electrode 28 is not limited to a metal nanowire; a transparent electrode film, such as an ITO, may be used.

The sealing layer 6 prevents foreign substances, such as water and oxygen, from intruding into the light emitter layer 5.

Individual components in the frame region NA around the display region DA will be described with reference to FIGS. 3 and 4.

As illustrated in FIG. 4, the display device 2A may include, in the frame region NA, the support substrate 10, a resin layer 12, a barrier layer 3, the thin-film transistor layer 4, and the sealing layer 6.

The display device 2A may include, in the frame region NA, dummy banks DB composed of the edge cover 23 shown in FIG. 4. The dummy banks DB may be used as spacers with which a mask and other things used in CVD to form a common layer in the display region DA are brought into contact.

The display device 2A may also include, in the frame region NA, a first bank BK1 composed of the edge cover 23, and a second bank BK2 composed of the flattening film 21 and edge cover 23, as illustrated in FIGS. 3 and 4. The first bank BK1 and the second bank BK2 are provided in the form of frames around the display region DA. The first bank BK1 and the second bank BK2 regulate the wetting and spread of an organic sealing film 32, which is included in the sealing layer 6 and is in a higher position, when the organic sealing film 32 is applied. The first bank BK1 in FIG. 4 for instance is in abutment with the end of the organic sealing film 32 to regulate the wetting and spreading of the organic sealing film 32.

As illustrated in FIGS. 3 and 4, the display device 2A includes, in the frame region NA, a trunk wire 34 disposed between the flattening film 21 and second electrode 28. The trunk wire 34 is in the same layer as the auxiliary wire 26 and is made of the same material as the auxiliary wire 26. As illustrated in FIG. 3, the auxiliary wire 26 branches from the trunk wire 34 and extends from the frame region NA to the display region DA. The auxiliary wire 26 branched from the trunk wire 34 is disposed in the form of a lattice at the foregoing location overlapping the edge cover 23 in the display region DA, as earlier described.

As illustrated in FIGS. 3 and 4, the frame region NA may have a slit 35, which constitutes an opening of the flattening film 21, at a location surrounding part of the perimeter of the display region DA. Monolithic gate drivers GD illustrated in FIGS. 3 and 4 may be provided by forming the thin-film transistors of the thin-film transistor layer 4. Such monolithic gate drivers GD are disposed closer to the display region DA than the slit 35 is and are disposed close to the perimeter of the display device 2A. It is noted that the slit 35 does not necessarily have to be provided.

The trunk wire 34 extends, along with the second electrode 28, through the slit 35 including the inside of the slit 35 toward the perimeter of the display device 2A, as illustrated in FIG. 4. As illustrated in FIG. 4, the frame region NA includes a conductive film 36 made of the same material as the first electrodes 22 and disposed in the same layer as the first electrodes 22. The conductive film 36 extends, in the frame region NA, from a location closer to the display region DA than the slit 35 is, through the inside of the slit 35 to a location closer to the perimeter of the display device 2A than the slit 35 is. The trunk wire 34 and the conductive film 36 are thus electrically connected together at a location including the inside of the slit 35.

The conductive film 36 also extends to a location overlapping the first bank BK1 and second bank BK2. Disposed at the location overlapping the first bank BK1 and second bank BK2 is a source conductive film 37 made of the same material and disposed in the same layer as the source wire SH of the thin-film transistor layer 4. The conductive film 36 and the source conductive film 37 are thus connected together at a first connection portion CN1, which is positioned at a location including the portion between the first bank BK1 and second bank BK2.

As illustrated in FIG. 3, the display device 2A includes a terminal section 38 in the frame region NA. The terminal section 38 is disposed on the periphery of the second bank BK2. The terminal section 38 includes, but not limited to, a driver (not shown) that supplies, via routed wires 39, a signal for driving the individual light emitters in the display region DA. The location where the routed wires 39 are routed among the four sides of the display region DA may have no slit 35.

The source conductive film 37 is also disposed at a location overlapping the routed wires 39 and overlapping the first bank BK1 and second bank BK2. The routed wires 39 and the source conductive film 37 are thus connected together at a second connection portion CN2, which overlaps the routed wires 39 and is positioned at a location including the portion between the first bank BK1 and second bank BK2.

The source conductive film 37 at the first connection portion CN1 and the source conductive film 37 at the second connection portion CN2 are in electrical conduction. This establishes an electrical connection between a high-voltage power source and the trunk wire 34, by extension, between the high-voltage power source and the auxiliary wires 26 via the routed wires 39, source conductive film 37 and conductive film 36. The auxiliary wires 26 are hence electrically connected to both of the high-voltage power source and second electrode 28 to thus reduce a voltage drop in the second electrode 28 that occurs at a location distant from the high-voltage power source.

It is noted that when the support substrate 10 is a flexible substrate, the display device 2A may have a bending section F extending between the second bank BK2 and terminal section 38 and along the perimeter of the display device 2A, as illustrated in FIG. 3. The actual display device 2A is bent along the bending section F, thus bending, along the bending section F, the periphery of the display device 2A including the terminal section 38 back to the backside of the display device 2A.

Figure 6:
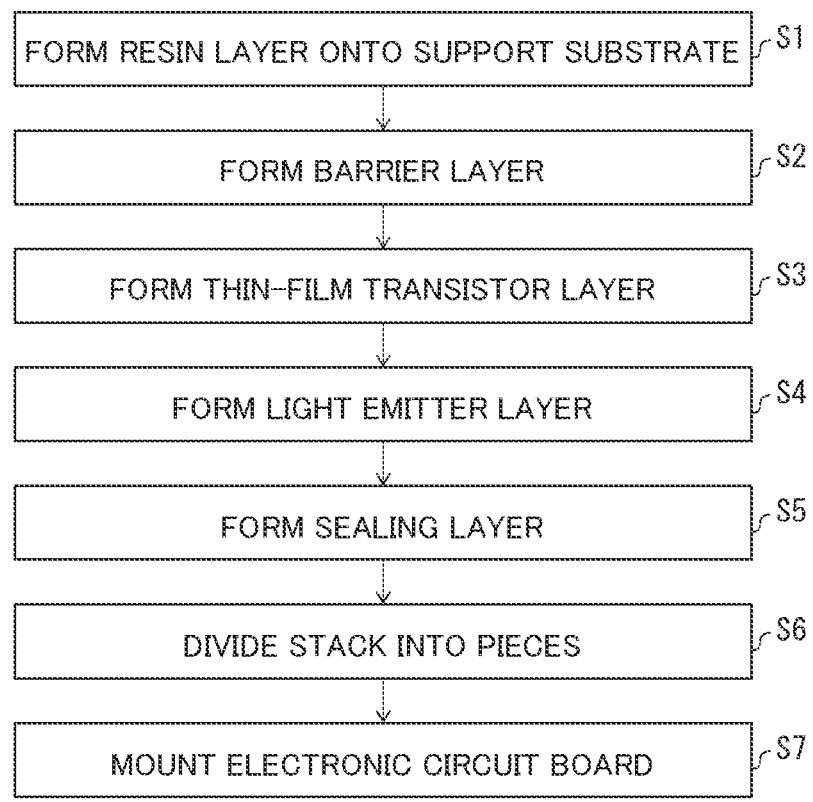
FIG. 6 is a flowchart showing a method for manufacturing the display device.

With reference to FIG. 6, a method for manufacturing the display device 2A according to this embodiment will be detailed. FIG. 6 is a flowchart showing individual process steps for manufacturing the display device 2A according to this embodiment.

The first process step is Step S1, i.e., forming the foregoing resin layer onto a light-transparency support substrate (e.g., a mother glass substrate). Next is Step S2, i.e., forming the foregoing barrier layer onto the resin layer. Next is Step S3, i.e., forming the thin-film transistor layer 4 onto the barrier layer. Forming the individual layers in Steps S1 to S3 can use a film formation method publicly known in the related art.

In some embodiments, Step S3 may include forming the source conductive film 37 together with the formation of the source wires SH. Step S3 may also include forming the slit 35 and part of the second bank along with the formation of the flattening film 21. Step S3 may also include forming transistors included in the monolithic gate drivers GD, along with the formation of thin-film transistors Tr included in the thin-film transistor layer 4.

Next is Step S4, i.e., forming the light emitter layer 5 onto the thin-film transistor layer 4. Step S4 is followed by Step S5, i.e., forming the sealing layer 6. Next is Step S6, i.e., dividing a stack of the support substrate 10, resin layer, barrier layer, thin-film transistor layer 4, light emitter layer 5 and sealing layer 6 into a plurality of pieces. Next is Step S7, i.e., mounting an electronic circuit board (e.g., an IC chip) onto the terminal section 38, and the display device 2A is thus completed.

In this embodiment, the foregoing light-transparency glass substrate may be used as is, as the support substrate 10. Nevertheless, adding some process steps can manufacture the display device 2A that is flexible.

For instance, Step S5 is followed by laser light irradiation to the lower surface of the resin layer via the light-transparency support substrate to thus reduce the binding force between the support substrate and resin layer, thus removing the support substrate from the resin layer. Next is attaching a lower film, such as a PET film, onto the lower surface of the resin layer to thus produce the support substrate 10. The process then proceeds to Step S6, thereby obtaining the display device 2A that is flexible. In this case, a process step of bending, along the bending section F, the side on which the terminal section 38 is disposed, back to the backside of the support substrate 10 may be performed between Steps S6 and S7.

First Modification

Figure 7:
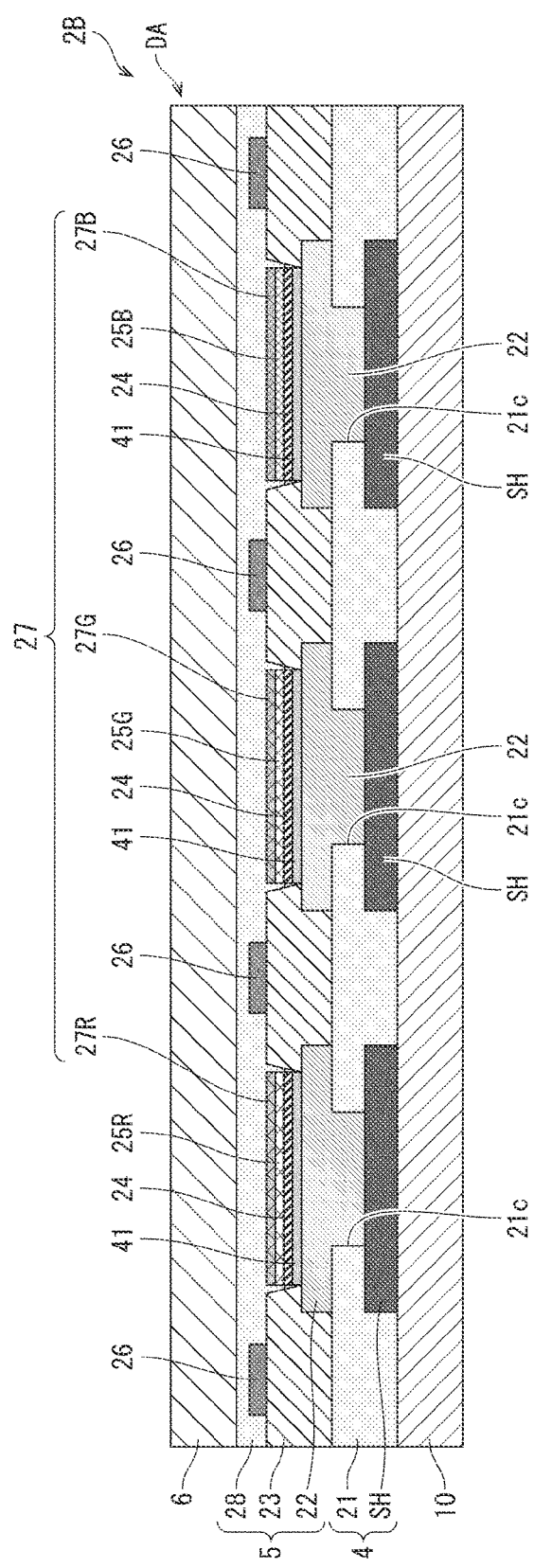
FIG. 7 is a sectional side view of an example specific configuration in a first modification of the display device.

FIG. 7 is a sectional side view of an example specific configuration of a display device 2B according to a first modification. Components similar to those described in the first embodiment will be denoted by similar reference signs, and the detailed description of the similar components will not be repeated.

In the forgoing example with reference to FIG. 2, the auxiliary wire 26 is disposed on the second electrode 28. In contrast, the display device 2B according to the first modification may include the auxiliary wire 26 disposed on the edge cover 23 so as to be covered by the second electrode 28, as illustrated in FIG. 7.

This configuration in the first modification can improve the flatness of the upper surface of the second electrode 28, thereby facilitating the formation of the sealing layer 6 when compared to the configuration in the first embodiment.

Second Modification

Figure 8:
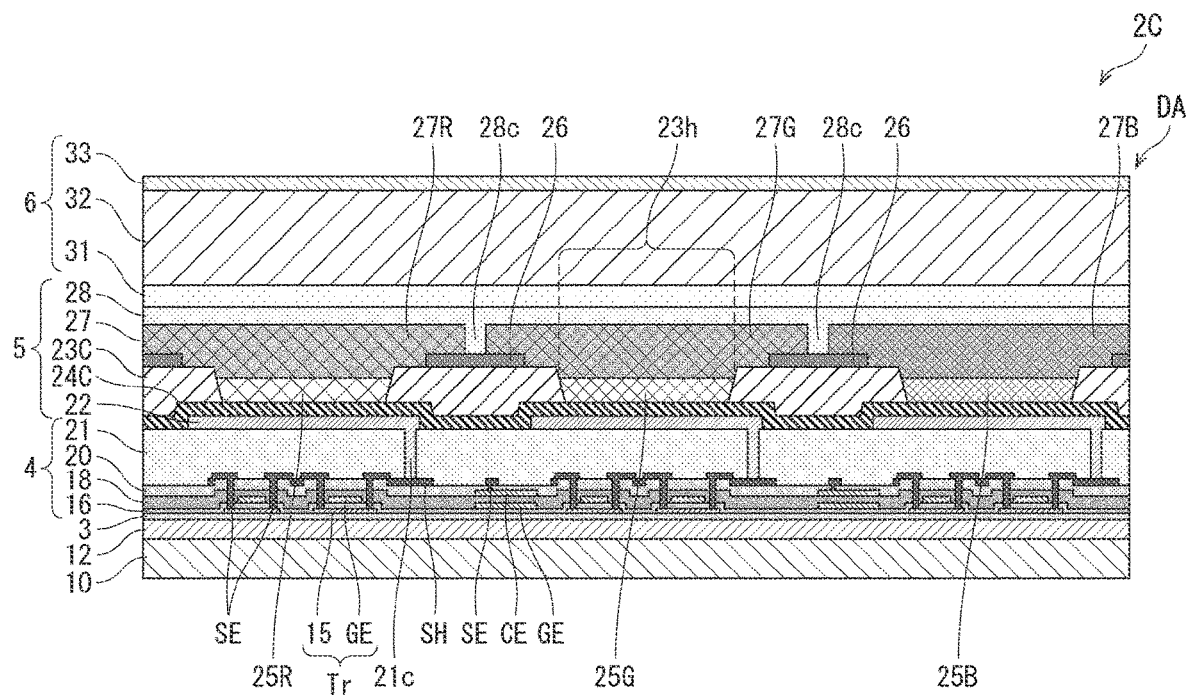
FIG. 8 is a sectional side view of an example specific configuration in a second modification of the display device.

FIG. 8 is a sectional side view of an example specific configuration of a display device 2C according to a second modification. Components similar to those described in the first embodiment will be denoted by similar reference signs, and the detailed description of the similar components will not be repeated.

In the modification illustrated in FIG. 8 and the subsequent modifications, the resin layer 12 and the barrier layer 3 are shown, whereas the hole injection layer 41 is omitted.

The thin-film transistor layer 4 includes, sequentially from the bottom, a semiconductor layer 15, a first inorganic layer 16 (gate insulating film), a gate electrode GE, a second inorganic layer 18, a capacitive electrode CE, a third inorganic layer 20, the source wire SH (metal wire layer), a source electrode SE, and the flattening film 21 (interlayer insulating film). The semiconductor layer 15, the first inorganic layer 16, and the gate electrode GE constitute one thin-film transistor Tr.

The semiconductor layer 15 is composed of low-temperature polysilicon (LTPS) or an oxide semiconductor for instance. Although FIG. 8 illustrates top-gate thin-film transistors each having the semiconductor layer 15 as its channel, bottom-gate thin-film transistors may be provided (for instance, when the channel of each thin-film transistor is composed of an oxide semiconductor).

The gate electrode GE and the capacitive electrode CE may contain at least one of, for instance, aluminum (Al), tungsten (W), molybdenum (Mo), tantalum (Ta), chromium (Cr), titanium (Ti), and copper (Cu). The gate electrode GE and the capacitive electrode CE are composed of a monolayer film or laminated film of the foregoing metals. The gate electrode GE in this embodiment in particular contains Mo.

The first inorganic layer 16, the second inorganic layer 18, and the third inorganic layer can be composed of a silicon oxide (SiOx) film or a silicon nitride (SiNx) film, both of which are formed through CVD, or can be composed of a stack of these films, for instance. The flattening film 21 can be made of an organic photosensitive material that can be applied, such as polyimide or acrylic. The flattening film 21 has the contact hole 21c bored in a location overlapping the source wire SH of each thin-film transistor Tr.

The sealing layer 6 includes a first inorganic sealing film 31 in a higher position than the second electrode 28, an organic sealing film 32 in a higher position than the first inorganic sealing film 31, and a second inorganic sealing film 33 in a higher position than the organic sealing film 32. The sealing layer 6 prevents foreign substances, such as water and oxygen, from intruding into the light emitter layer 5. The first inorganic sealing film 31 and the second inorganic seal film 33 can be composed of a silicon oxide film, a silicon nitride film, or a silicon oxide nitride film, all of which are formed through CVD, or can be composed of a stack of these films, for instance. The organic sealing film 32 can be made of an organic photosensitive material that can be applied, such as polyimide or acrylic.

The second electrode 28 is disposed also at locations overlapping contact holes bored in the electron transportation layer 27 and thus constitutes contact portions 28c, thus establishing electrical connection between the auxiliary wire 26 and second electrode 28.

An edge cover 23C may be disposed on a hole transportation layer 24C, which is shared among the red sub-pixel, green sub-pixel and blue sub-pixel. The edge cover 23C has an opening 23h, provided for each of the plurality of light emitters, and part of the hole transportation layer 24C is exposed from the edge cover 23C.

As illustrated in FIG. 8, the edge cover 23C of the display device 2C covers the edge of the hole transportation layer 24C corresponding to the red emissive layer 25R and exposes the middle of the hole transportation layer 24C corresponding to the red emissive layer 25R. The edge cover 23C also covers the edge of the hole transportation layer 24C corresponding to the green emissive layer 25G and exposes the middle of the hole transportation layer 24C corresponding to the green emissive layer 25G. The edge cover 23C also covers the edge of the hole transportation layer 24C corresponding to the blue emissive layer 25B and exposes the middle of the hole transportation layer 24C corresponding to the blue emissive layer 25B.

Third Modification

Figure 9:
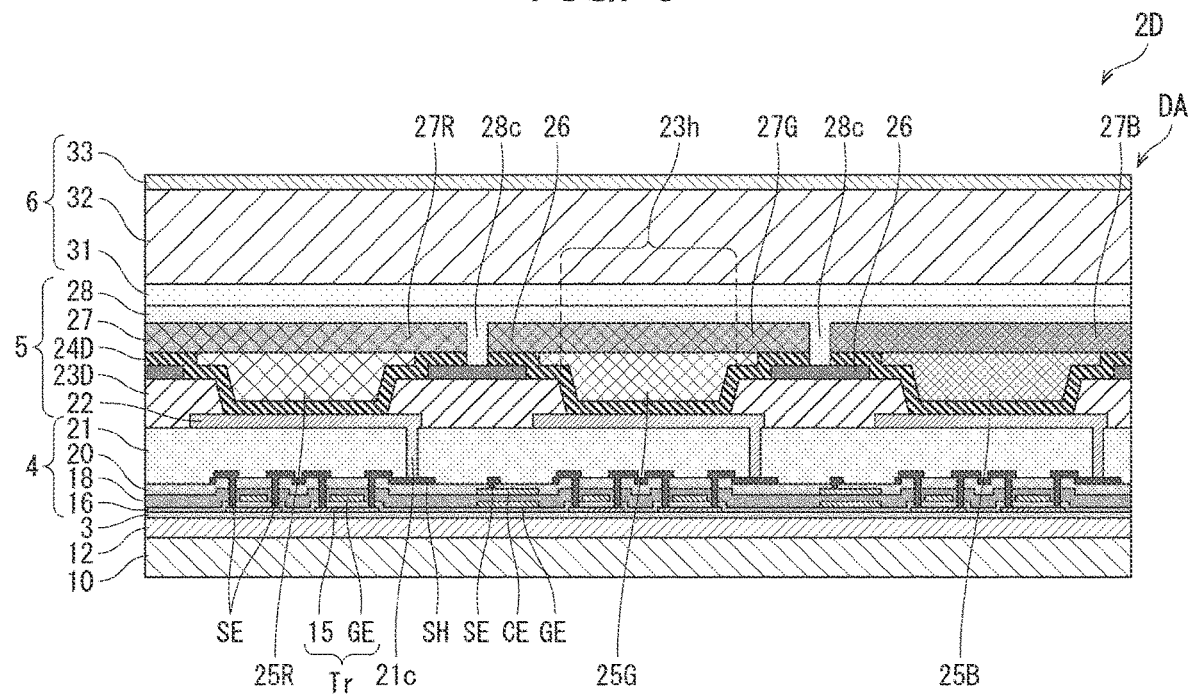
FIG. 9 is a sectional side view of an example specific configuration in a third modification of the display device.

FIG. 9 is a sectional side view of an example specific configuration of a display device 2D according to a third modification. Components similar to those described in the second modification will be denoted by similar reference signs, and the detailed description of the similar components will not be repeated.

The display device 2D includes an edge cover 23D. The edge cover 23D has the opening 23h, provided for each of the plurality of light emitters, and part of each first electrode 22 is exposed from the edge cover 23D. A hole transportation layer 24D is disposed over the edge cover 23D, openings 23h and auxiliary wire 26.

The hole transportation layer 24D has contact holes overlapping the contact holes of the electron transportation layer 27 and extending to the auxiliary wire 26. The contact portions 28c reach the auxiliary wire 26, thus establishing electrical connection between the auxiliary wire 26 and second electrode 28.

As illustrated in FIG. 9, the edge cover 23D of the display device 2D covers the edge of the first electrode 22 corresponding to the red emissive layer 25R and exposes the middle of this first electrode 22. The edge cover 23D also covers the edge of the first electrode 22 corresponding to the green emissive layer 25G and exposes the middle of this first electrode 22. The edge cover 23D also covers the edge of the first electrode 22 corresponding to the blue emissive layer 25B and exposes the middle of this first electrode 22. The foregoing holds true for FIG. 10, which will be described later on.

Fourth Modification

Figure 10:
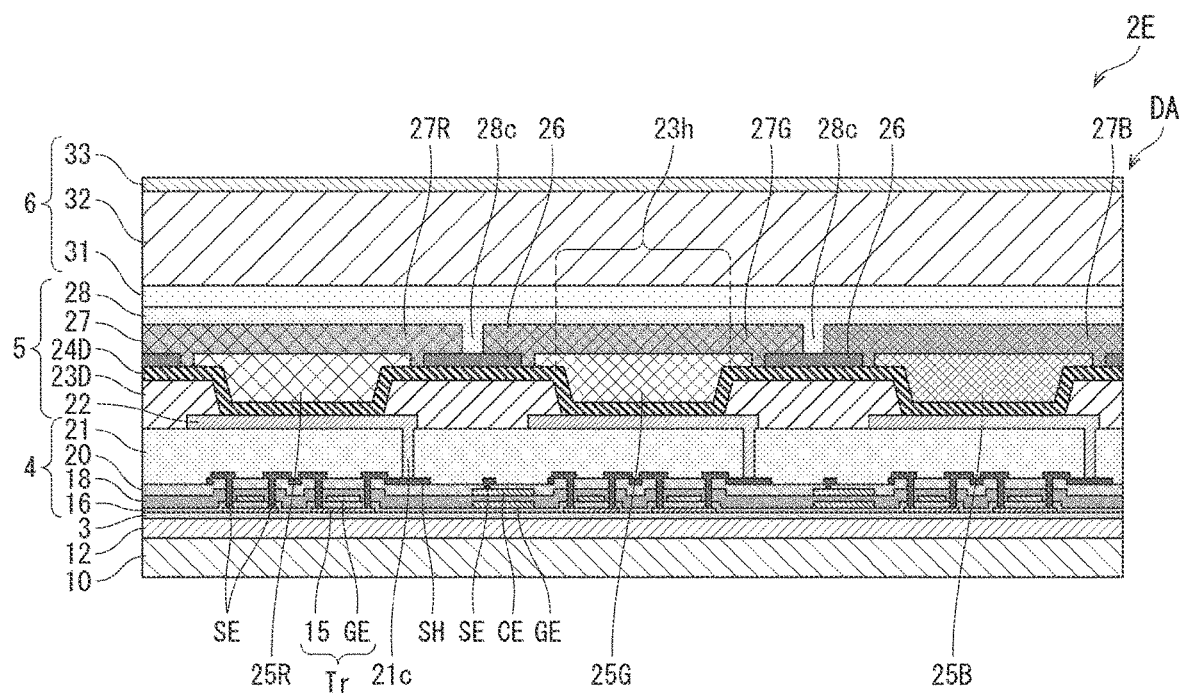
FIG. 10 is a sectional side view of an example specific configuration in a fourth modification of the display device.

FIG. 10 is a sectional side view of an example specific configuration of a display device 2E according to a fourth modification. Components similar to those described in the third modification will be denoted by similar reference signs, and the detailed description of the similar components will not be repeated.

In contrast to the auxiliary wire 26 in the third modification, the auxiliary wire 26 in this modification is disposed on the upper surface of the hole transportation layer 24D. Contact holes constituting the contact portions 28c are in this case bored in only the electron transportation layer 27 rather than in the hole transportation layer 24D.

Second Embodiment

Figure 11:
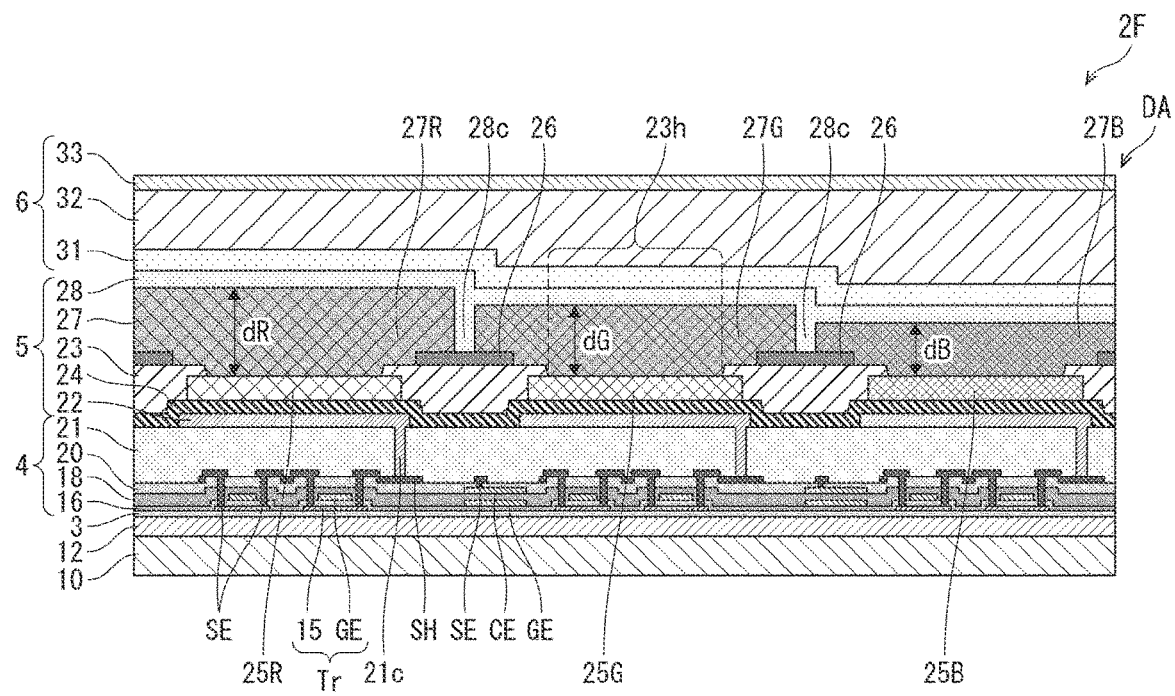
FIG. 11 is a sectional side view of an example specific configuration of a display device according to a second embodiment.

FIG. 11 is a sectional side view of an example specific configuration of a display device 2F according to a second embodiment. Components similar to those described in the second modification will be denoted by similar reference signs, and the detailed description of the similar components will not be repeated.

The display device 2F according to the second embodiment is different from the display device 2C according to the second modification in that the electron transportation layer 27R, the electron transportation layer 27G, and the electron transportation layer 27B have their respective thicknesses different from each other, and that the edge cover 23 covers the edges of the red emissive layer 25R, green emissive layer 25G and blue emissive layer 25B.

The electron transportation layer 27R has a thickness dR of 80 nm, the electron transportation layer 27G has a thickness dG of 60 nm, and the electron transportation layer 27B has a thickness dB of 40 nm. That is, the thickness dR of the electron transportation layer 27R is larger than the thickness dG of the electron transportation layer 27G, and the thickness dG is larger than the thickness dB of the electron transportation layer 27B.

Expression (1) below is established by Child's law, where J denotes the density of current flowing through any of the electron transportation layers 27R, 27G and 27B of the light emitters of the display device 2F according to this embodiment.

$$J=9\varepsilon_r\varepsilon_0\mu_e V^2/8d^3 \qquad (1)$$

Here, $\varepsilon_r$ denotes the relative permittivity of each of the electron transportation layers 27R, 27G and 27B with respect to a vacuum, and $\varepsilon_0$ denotes the vacuum permittivity of each of the electron transportation layers 27R, 27G and 27B. $\mu_e$ denotes the mobility of electrons within each of the electron transportation layers 27R, 27G and 27B. V denotes the voltage applied across each of the electron transportation layers 27R, 27G and 27B. d denotes the thickness of each of the electron transportation layers 27R, 27G and 27B.

Expression (1) above demonstrates that the density of the current flowing through the electron transportation layers 27R, 27G and 27B increases along with decrease in the thickness of the electron transportation layers 27R, 27G and 27B. Accordingly, setting the thickness dR to be larger than the thickness dG as well as setting the thickness dG to be larger than the thickness dB enables the density of the current flowing through the electron transportation layer 27G and electron transportation layer 27B to be higher than the density of the current flowing through the electron transportation layer 27R.

The current flowing through the electron transportation layer 27R has a high density, thus increasing the density of electrons injected from the electron transportation layer 27 to the emissive layer 25. The foregoing configuration can thus optimize, between the light emitters, the efficiency of electron injection from the electron transportation layer 27 to the emissive layer 25, which results from the difference in energy level between the electron transportation layer 27 and emissive layer 25.

It is noted that the material of the individual electron transportation layers 27R, 27G and 27B may differ between the light emitters. Both thickness and material differ between the electron transportation layers 27R, 27G and 27B, which are different from each other. This can more efficiently optimize, between the light emitters, the efficiency of electron injection from the electron transportation layer 27 to the emissive layer 25.

As illustrated in FIG. 11, the edge cover 23 covers the edge of the red emissive layer 25R and exposes the middle of the red emissive layer 25R. The edge cover 23 also covers the edge of the green emissive layer 25G and exposes the middle of the green emissive layer 25G. The edge cover 23 also covers the edge of the blue emissive layer 25B and exposes the middle of the blue emissive layer 25B. The foregoing holds true for FIGS. 12 and 13, which will be described later on.

Third Embodiment

Figure 12:
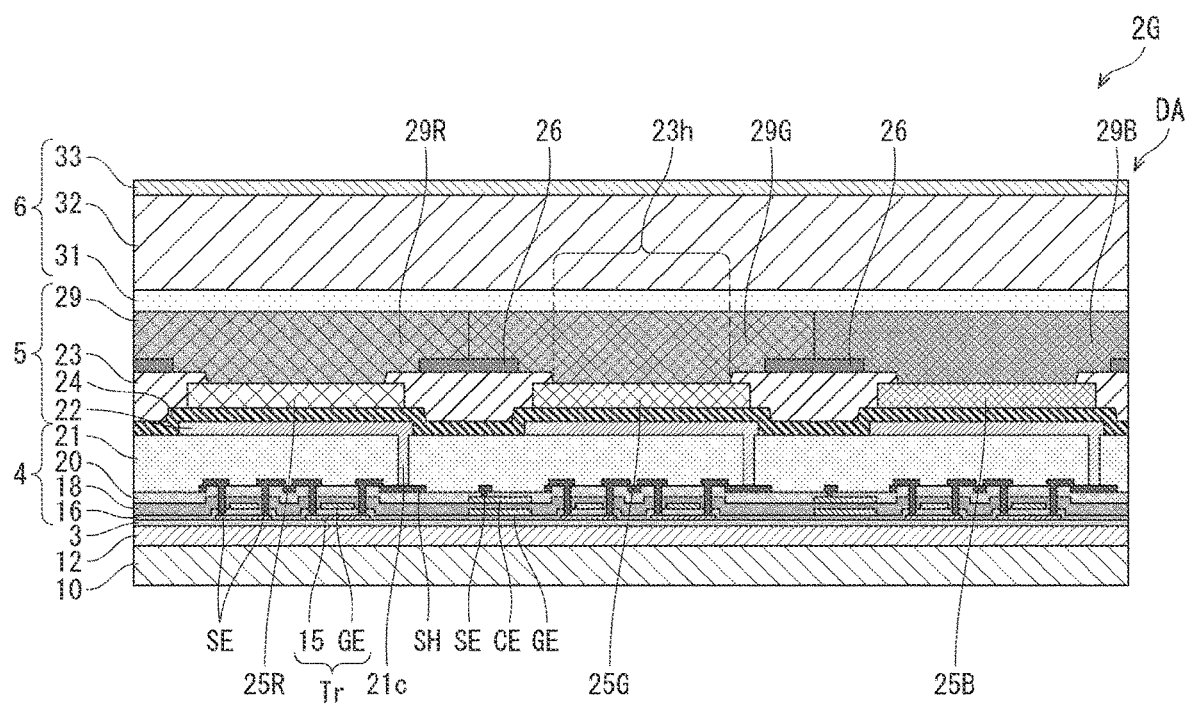
FIG. 12 is a sectional side view of an example specific configuration of a display device according to a third embodiment.

FIG. 12 is a sectional side view of an example specific configuration of a display device 2G according to a third embodiment. Components similar to those described in the second modification will be denoted by similar reference signs, and the detailed description of the similar components will not be repeated.

The display device 2G according to the third embodiment is different from the display device 2C, described with reference to FIG. 8, in that the electron transportation layer 27 and second electrode 28 are replaced with an electron transportation layer 29, and that the edge cover 23 covers the edges of the red emissive layer 25R, green emissive layer 25G and blue emissive layer 25B.

The electron transportation layer 29 is disposed at a location overlapping each first electrode 22 and is provided for each of the plurality of light emitters, like the electron transportation layer 27. The electron transportation layer 29 in this embodiment includes an electron transportation layer 29R for the red light emitter 5R, an electron transportation layer 29G for the green light emitter 5G, and an electron transportation layer 29B for the blue light emitter 5B.

The electron transportation layer 29 contains both of the material of the electron transportation layer 27 and the material of the second electrode 28. For instance, the electron transportation layer 29 contains a photosensitive material and oxide nanoparticles and further contains metal nanowires (not shown) dispersed within the photosensitive material. The electron transportation layer 29 thus functions also as a counter electrode corresponding to the first electrodes 22. In other words, the display device 2G according to this embodiment may be regarded as the display device 2C, earlier described with reference to FIG. 8, that includes the electron transportation layer 29 serving as the electron transportation layer 27 and second electrode 28.

In this embodiment, the auxiliary wire 26 on the edge cover 23 is in direct contact with the electron transportation layer 29, which functions as the second electrode. This eliminates the need for boring contact holes in the electron transportation layer 29 in order to establish electrical connection between the auxiliary wire 26 and second electrode. No such contact holes are provided in this embodiment, thus reducing requirements for positional accuracy in forming components, such as the emissive layer 25, thereby more easily offering the display device 2G with high resolution.

Fourth Embodiment

Figure 13:
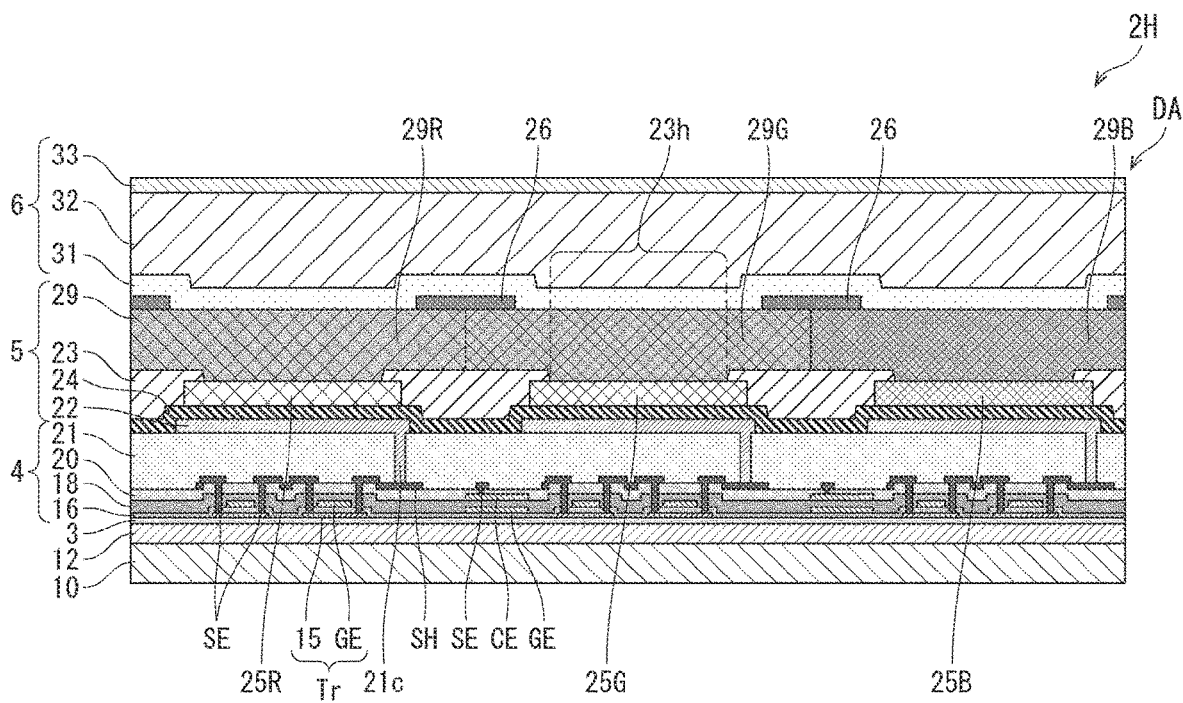
FIG. 13 is a sectional side view of an example specific configuration of a display device according to a fourth embodiment.

FIG. 13 is a sectional side view of an example specific configuration of a display device 2H according to a fourth embodiment. Components similar to those described in the third embodiment will be denoted by similar reference signs, and the detailed description of the similar components will not be repeated.

The display device 2H according to this embodiment is different from the display device 2G, described with reference to FIG. 12 according to the preceding embodiment, only in that the auxiliary wire 26 is disposed between the electron transportation layer 29 and first inorganic sealing film 31 and is in contact with the electron transportation layer 29 adjacent to the sealing layer 6.

Like the third embodiment, this embodiment eliminates the need for boring contact holes in the electron transportation layer 29, thus reducing requirements for positional accuracy in forming components, such as the emissive layer 25, thereby more easily offering the display device 2H with high resolution.

The auxiliary wire 26 in this embodiment is formed after the electron transportation layer 29 is formed. This reduces damage to each layer under the electron transportation layer 29 during patterning of the auxiliary wire 26.

The electron transportation layer 29 contains metal nanowires dispersed within a photosensitive resin. The metal nanowires are thus buried in the electron transportation layer 29. Thus in this embodiment, the metal nanowires within the electron transportation layer 29 are less susceptible to damage during the patterning of the auxiliary wire 26. This eliminates the need for forming, but not limited to, a protective film for protecting the electron transportation layer 29 onto the electron transportation layer 29 in order to pattern the auxiliary wire 26.

The light emitter layer 5 of the display devices 2A to 2H according to the foregoing respective embodiments may be flexible and bendable. The foregoing embodiments have described, by way of example, that the emissive layer 25 is a quantum-dot layer containing quantum dots, and that the light emitter layer 5 includes quantum-dot light-emitting diodes (QLEDs) as light emitters. The emissive layer 25 according to the foregoing embodiments may be an organic layer. That is, the light emitter layer 5 according to the foregoing embodiments may include organic light-emitting diodes (OLEDs) as light emitters. The display devices 2A to 2H according to the respective embodiments in this case may be organic electroluminescence (EL) displays.

The disclosure is not limited to the foregoing embodiments. Various modifications can be devised within the scope of the claims. An embodiment obtained in combination, as appropriate, with the technical means disclosed in the respective embodiments is also included in the technical scope of the disclosure. Furthermore, combining the technical means disclosed in the respective embodiments can form a new technical feature.

The invention claimed is:

1. A display device comprising:
a display region having a plurality of pixels; and
a frame region around the display region,
wherein the display region includes, in listing order, a substrate, a thin-film transistor layer, a light emitter layer having a plurality of light emitters configured to emit mutually different colors of light, and a sealing layer sealing the light emitter layer,
the plurality of light emitters include, in listing order on the substrate, a first electrode, a hole transportation layer, an emissive layer, an electron transportation layer, and a second electrode,
either one of the first electrode and the second electrode is an island-shaped electrode provided for each of the plurality of light emitters,
the other one of the first electrode and the second electrode is a common electrode shared among the plurality of light emitters, and
the electron transportation layer contains an oxide nanoparticle, a binder resin, and a photo-initiator.

2. The display device according to claim 1, wherein the photo-initiator contains a compound that generates no acid in response to light irradiation for initiating a polymerization reaction.

3. The display device according to claim 1, wherein
the photo-initiator contains at least one of an acetophenone-based compound, benzophenone-based compound, and a propiophenone-based compound.

4. The display device according to claim 1, wherein
the plurality of light emitters include
a red light emitter with a red emissive layer included in the emissive layer, the red emissive layer being configured to emit red light,
a green light emitter with a green emissive layer included in the emissive layer, the green emissive layer being configured to emit green light, and
a blue light emitter with a blue emissive layer included in the emissive layer, the blue emissive layer being configured to emit blue light, and
each of the plurality of pixels includes
a red sub-pixel including the red light emitter,
a green sub-pixel including the green light emitter, and
a blue sub-pixel including the blue light emitter.

5. The display device according to claim 4, wherein a material of the electron transportation layer differs between the red light emitter, the green light emitter, and the blue light emitter.

6. The display device according to claim 5, wherein
the oxide nanoparticle within the electron transportation layer of the red light emitter is a ZnO nanoparticle,
the oxide nanoparticle within the electron transportation layer of the green light emitter is a MgZnO nanoparticle, and
the oxide nanoparticle within the electron transportation layer of the blue light emitter is a LiZnO nanoparticle.

7. The display device according to claim 5, wherein
the oxide nanoparticle within the electron transportation layer of the red light emitter, the oxide nanoparticle within the electron transportation layer of the green light emitter, and the oxide nanoparticle within the electron transportation layer of the blue light emitter are ZnO nanoparticles,
a diameter of the ZnO nanoparticle within the electron transportation layer of the red light emitter is larger than a diameter of the ZnO nanoparticle within the electron transportation layer of the green light emitter, and
the diameter of the ZnO nanoparticle within the electron transportation layer of the green light emitter is larger than a diameter of the ZnO nanoparticle within the electron transportation layer of the blue light emitter.

8. The display device according to claim 7, wherein
the diameter of the ZnO nanoparticle within the electron transportation layer of the red light emitter is 5 to 8 nm inclusive,
the diameter of the ZnO nanoparticle within the electron transportation layer of the green light emitter is 3 to 5 nm inclusive, and
the diameter of the ZnO nanoparticle within the electron transportation layer of the blue light emitter is 1.5 to 3 nm inclusive.

9. The display device according to claim 5, wherein
the oxide nanoparticle within the electron transportation layer of the red light emitter is a $Mg_{xr}Zn_{(1-xr)}O$ nanoparticle,
the oxide nanoparticle within the electron transportation layer of the green light emitter is a $Mg_{xg}Zn_{(1-xg)}O$ nanoparticle,
the oxide nanoparticle within the electron transportation layer of the blue light emitter is a MgxgZn(1-xg)O nanoparticle,
xr, xg, and xb are real numbers equal to or greater than 0 and less than 1, and
xr<xg<xb is satisfied.

10. The display device according to claim 9, wherein
xr is equal to or greater than 0 and less than 0.1,
xg is equal to or greater than 0.1 and less than 0.3, and
xb is equal to or greater than 0.3 and less than 0.5.

11. The display device according to claim 4, wherein
a thickness of the electron transportation layer of the red light emitter, a thickness of the electron transportation layer of the green light emitter, and a thickness of the electron transportation layer of the blue light emitter are different from each other.

12. The display device according to claim 11, wherein
the thickness of the electron transportation layer decreases gradually in order starting with the red light emitter, followed by the green light emitter, followed by the blue light emitter.

13. The display device according to claim 5, wherein
the light emitter layer further includes
an edge cover dividing the plurality of pixels into the red sub-pixel, the green sub-pixel, and the blue sub-pixel, and
an auxiliary wire having a lattice shape and disposed at a location overlapping the edge cover, and
the auxiliary wire and the second electrode are electrically connected together.

14. The display device according to claim 13, wherein the auxiliary wire is in contact with the edge cover adjacent to the sealing layer.

15. The display device according to claim 13, wherein the auxiliary wire is in contact with the second electrode adjacent to the sealing layer.

16. The display device according to claim 2, wherein the common electrode contains a metal nanowire.

17. The display device according to claim 2, wherein the binder resin is any one of a monosubstituted ethylene compound, a 1,1-disubstituted ethylene compound, and a diene compound.

18. The display device according to claim 13, wherein the edge cover covers an edge of the hole transportation layer and exposes the hole transportation layer.

19. The display device according to claim 13, wherein the edge cover covers an edge of the emissive layer and exposes the emissive layer.

20. The display device according to claim 13, wherein the edge cover covers an edge of the first electrode and exposes the first electrode.

* * * * *